United States Patent
Doubler et al.

(10) Patent No.: US 8,138,790 B1
(45) Date of Patent: *Mar. 20, 2012

(54) LATENCY MEASUREMENTS FOR WIRELESS COMMUNICATIONS

(75) Inventors: James Doubler, Wheaton, IL (US); Michael Hammer, Westchester, IL (US); Jin Zhang, Lake Zurich, IL (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/083,889

(22) Filed: Apr. 11, 2011

Related U.S. Application Data

(63) Continuation of application No. 12/706,227, filed on Feb. 16, 2010, now Pat. No. 7,924,054.

(51) Int. Cl.
*H03K 19/177* (2006.01)

(52) U.S. Cl. ............................................. 326/41; 326/93
(58) Field of Classification Search ............... 326/37–41, 326/46, 93–98
See application file for complete search history.

(56) References Cited

U.S. PATENT DOCUMENTS

| | | | |
|---|---|---|---|
| 7,519,879 B2 * | 4/2009 | Woodward et al. | 714/724 |
| 7,924,054 B1 * | 4/2011 | Doubler et al. | 326/41 |

* cited by examiner

*Primary Examiner* — Don Le

(57) ABSTRACT

In one embodiment, a programmable logic device (PLD) includes a programmable fabric and hard logic coupled to the programmable fabric. The hard logic includes a timing measurement circuit adapted to measure latency of a data path between first and second points in the programmable logic device, such as the latency of a data path through a link interface configured within the programmable fabric.

19 Claims, 3 Drawing Sheets

LATENCY MEASUREMENTS FOR WIRELESS COMMUNICATIONS

RELATED APPLICATION DATA

This application is a continuation of U.S. application Ser. No. 12/706,227, filed Feb. 16, 2010, which is incorporated herein by reference in its entirety.

TECHNICAL FIELD

The present invention relates generally to measuring latency of data paths within programmable logic devices such as FPGAs, and more particularly to the measurement of latency across wireless communication interfaces implemented in a programmable logic device.

BACKGROUND

Cellular telephony systems provide coverage across broad areas using cells, where each cell is serviced by a corresponding cellular base station. A conventional base station is located adjacent the bank of antennas and amplifiers the base station uses to service its cell. As cellular providers support increasingly sophisticated services such as 3G (the third generation of standards for mobile networking), the real estate demands for the base stations necessary to support each cell in a cellular network increase. It was conventional for a base station to be entirely vendor-specific such that the designs and protocols used in a base station would depend upon the particular manufacturer used to provide the base station. This lack of standardization leads to higher costs for the base station buyers. These higher costs as well as the costs for the real estate necessary to house the base station have motivated the development of several base station standardization initiatives. For example, a cellular telephony consortium developed a standardized interface denoted as the Common Public Radio Interface (CPRI). A competing standard known as the Open Base Station Architecture Initiative (OBSAI) has also been developed. In a CPRI system, the base stations, which comprise part of what is referred to as Radio Equipment Control, are located remotely from the cellular amplifiers and antennas—the amplifiers and antennas being part of what is denoted as Radio Equipment. A similar separation between a radio head and a base station server exists in the OBSAI protocol such that both CPRI and OBSAI enabled a distributed architecture. In this fashion, a CPRI or OBSAI base station need not be located in a costly (and environmentally challenging) location such as urban rooftops or adjacent power station towers that hold the radio head. In addition, the standardized nature of these protocols offers inherent cost savings to cellular providers as equipment providers must directly compete with each other because they offer the same standardized equipment. As a result, cellular telephony systems organized according to the CPRI or OBSAI protocol are growing in popularity.

This popularity has introduced some complexity in that radio base station systems have very strict link timing accuracy requirements with regard to data path latency between components. But such strict timing accuracy is necessary so the varying equipment vendors who incorporate standardized interfaces such as CPRI into their designs can produce equipment that can be integrated into a resulting system that meets overall system-level latency requirements. To meet such stringent latency requirements, it is common to accurately control the latency variation that exists in the elements implementing the data path. By accurately controlling the latency variation, the overall latency through the link components can be essentially fixed for a given design. But such accurate control is problematic when the digital logic implementing the interface contains elements that have inherently-high latency variation. For example, the use of First-In-First-Out (FIFO) buffers to transfer data between different clock domains introduces a variable amount of buffer delay in the data path. In addition, it is often desirable to use a properly-configured programmable logic device such as a Field Programmable Gate Array (FPGA) to implement a CPRI interface. But the resulting FPGA logic will vary from design to design and thus introduce variable amounts of delay accordingly.

To control the delay variation in the FPGA logic, it is common to bypass any FIFOs in the FPGA's Physical Coding Sublayer (PCS) SErializer-DESerializer (SERDES) modules. Such modules are necessary since the data in the standardized interface such as CPRI arrives in high speed serialized form that must be parallelized by the SERDES so that the lower speed clock in an FPGA can accommodate the necessary data processing. Typically, the logic in such modules is hardwired as opposed to the programmable logic in the FPGA core. Not only are these FIFOs avoided but it is also common to avoid the use of any FIFOs in the FPGA core to control the delay variation. Thus, the resulting FPGA design must tightly control all data transfers between different clock domains by constraining the phase difference between the clocks. Despite such precautions, it is still necessary to measure the latency from one FPGA route to the next using labor-intensive software tools. As a result, the design of standardized interfaces such as CPRI interfaces in FPGA logic is highly constrained and difficult.

Accordingly, there is a need in the art for improved techniques for measuring the latency of data paths within an FPGA.

SUMMARY

In one embodiment of the invention, a programmable logic device includes a programmable fabric and hard logic coupled to the programmable fabric, the hard logic including a timing measurement circuit adapted to measure latency of a data path between first and second points in the programmable logic device. The hard logic may further include a SERDES channel and at least a portion of the data path is within the SERDES channel.

In another embodiment of the invention, a programmable logic device includes a programmable fabric and hard logic within the device coupled to the programmable fabric, the hard logic including a timing measurement circuit adapted to measure latency of a data path between multiple points in the programmable logic device. The timing measurement circuit includes a plurality of pattern matching circuits, each coupled to one of the points in the device; a counter; a first multiplexer coupled between at least two pattern matching circuits and the counter; a status register coupled to the counter; and a second multiplexer coupled between at least two pattern matching circuits and the status register.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodi-

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

A programmable logic device is disclosed that eliminates the need to control latency variation in the implementation of standardized interfaces such as an Open Base Station Architecture Initiative (OBSAI) or Common Public Radio Interface (CPRI) interface. To provide such an advantage, the programmable logic device (PLD) measures the latency of the data path directly in real time. In this fashion, PLD configuration is greatly simplified while at the same time meeting latency requirements with greater precision.

Although the following discussion will relate to an FPGA, the principles from the disclosure may be readily applied to other types of PLDs such a Complex Programmable Logic Device (CPLD) In addition, it will be appreciated that CPRI has proven to be considerably more popular than OBSAI for the type of standardized interface used in base station and radio head interfaces. Accordingly, although the following examples will relate to an FPGA implementation for a CPRI interface, it will be appreciated that such examples may be readily extended into analogous implementations for OBSAI or other standardized communication interfaces.

Figure 1:
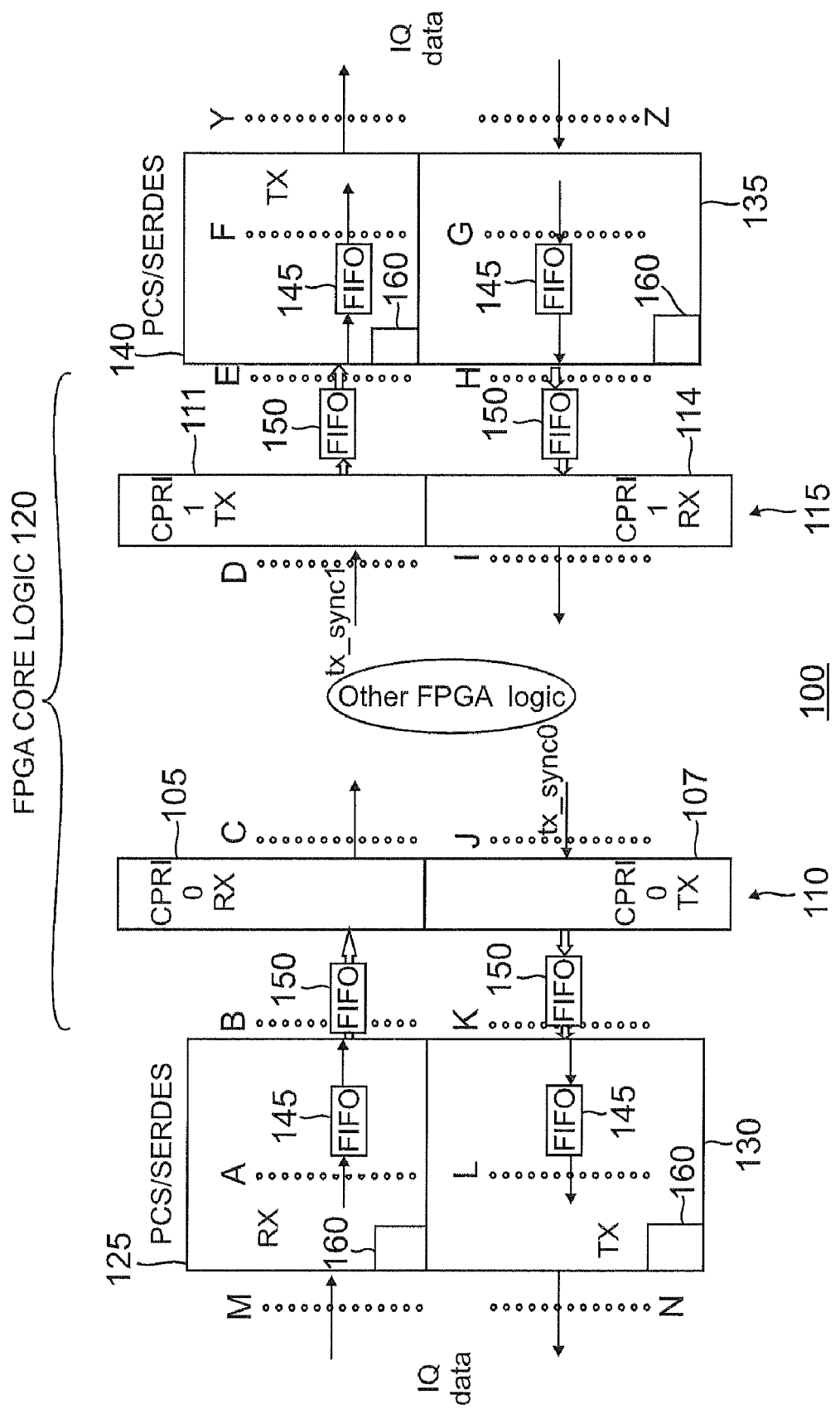
FIG. 1 illustrates an FPGA configured according to an embodiment of the invention.

Turning now to the drawings, FIG. 1 illustrates an FPGA 100 configured to implement two CPRI interfaces. In general, a radio equipment (RE) component in the CPRI standard must have two interfaces—a slave interface and a master interface. In this fashion, multiple REs may be daisy-chained and coupled to a single base station Radio Equipment Control (REC) component. It will be appreciated, however, that FPGA 100 may be modified to implement just one or more than two CPRI interfaces. Each CPRI interface includes a receiver interface and a transmitter interface. For example, a first CPRI interface 110 (CPRI 0) includes a receiver interface 105 and a transmitter interface 107. Similarly, a second CPRI interface 115 (CPRI 1) includes a receiver interface 114 and a transmitter interface 111. In this fashion, CPRI IQ data may flow through interfaces 110 and 115 as desired. CPRI interfaces 110 and 115 are implemented through appropriate programming of FPGA programmable core logic 120.

As discussed previously, it was conventional to program an FPGA's core logic (such as logic 120) to implement such CPRI interfaces. In that regard, an FPGA is typically unable to have a fast enough clock so as to process the high speed serial IQ data flow received by CPRI interfaces from other CPRI components. Thus, FPGA 100 includes a plurality of Physical Coding Sublayer (PCS)/Serializer-Deserializer (SERDES) modules that deserialize this high-speed serial IQ data into parallel IQ data words that can then be processed at the slower internal clock speeds of an FPGA. A PCS/SER-DES module 125 presents deserialized CPRI data words to receiver interface 105 whereas a PCS/SERDES module 130 serializes CPRI data words from transmitter interface 107. Similarly, a PCS/SERDES module 135 deserializes high-speed serial IQ data into parallel IQ data words for reception by receiver interface 114 whereas a PCS/SERDES module 140 serializes IQ data words received from transmitter interface 111. To accommodate the translations across different clock domains, each PCS/SERDES module includes a First-In-First-Out buffer 145. Similarly, the FPGA core logic also includes a plurality of FIFO buffers 150.

If FPGA 100 included nothing further than the components just described, it may be observed that a conventional FPGA implementation for interfaces 110 and 115 would also contain the same functionality. Thus, without the inclusion of additional features or programmed functionality, FPGA 100 would suffer from the issues discussed previously with regard to avoiding the use of FIFOs 145 and 150. That avoidance would then require labor-intensive testing to ensure that latency requirements are met, thereby resulting in constrained and difficult configuration of logic core 120.

Figure 2:
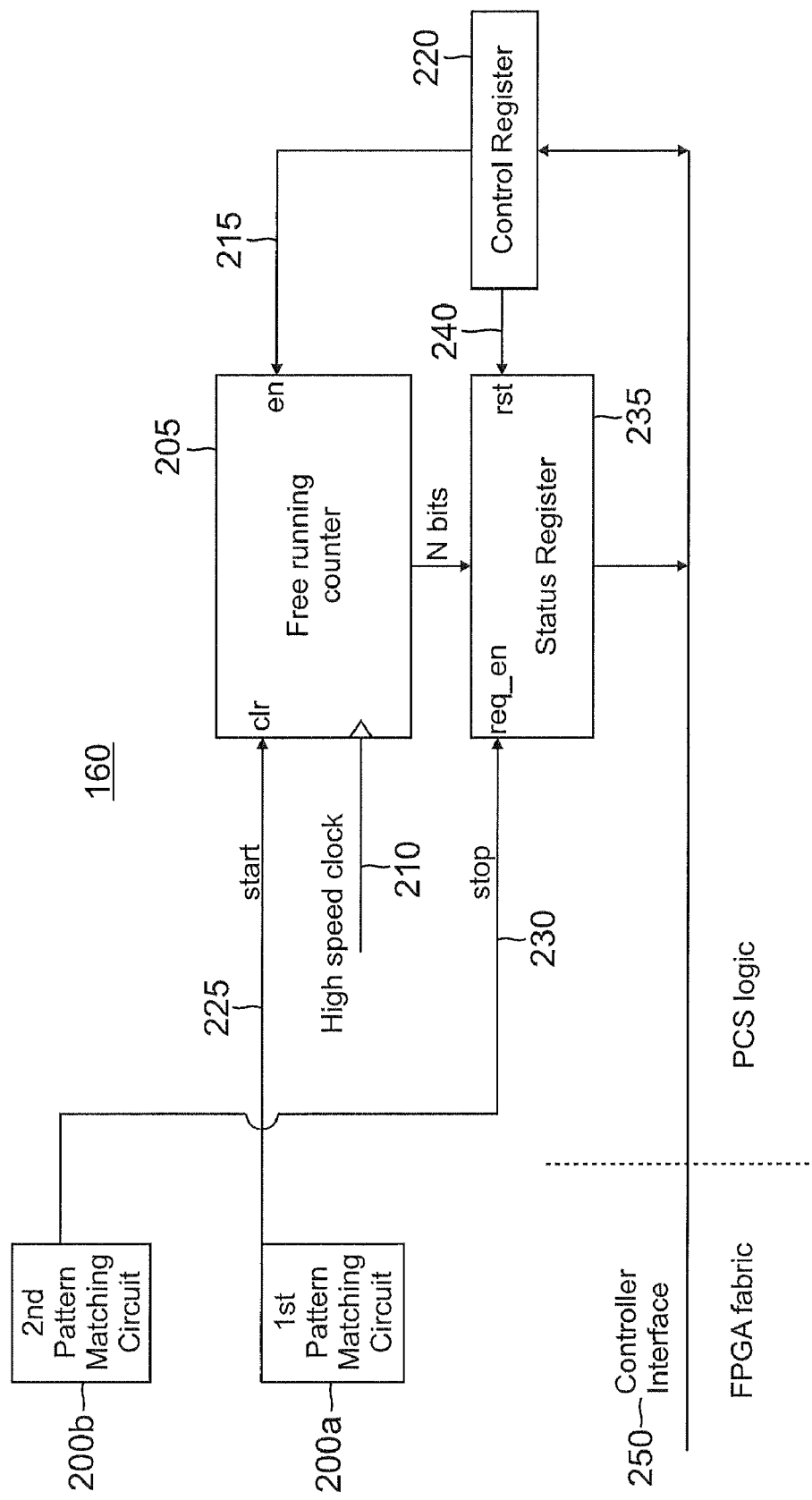
FIG. 2 illustrates the timing measurement circuit for the PCS/SERDES modules of FIG. 1.

To free FPGA 100 from such constraints, each PCS/SERDES module includes a timing measurement circuit 160. FIG. 2 provides a block diagram for an example timing measurement circuit 160. As will be explained further herein, by including timing measurement circuits 160 in FPGA 100, FPGA 100 is enabled to measure the latency in the propagation of a given CPRI data word across the CPRI interfaces. For example, this latency may be measured with regard to points A through L in FGPGA 100 but other locations could also be tested for latency.

The resulting latency measurements may be better understood by a discussion of the CPRI IQ data word organization. CPRI IQ data words are organized into basic frames. In turn, the frames are organized into hyperframes such that two-hundred-fifty-six basic frames form each hyperframe. Finally, the hyperframes may be organized with regard to the cellular standard being implemented—for example, in the Universal Mobile Telecommunications System (UMTS) standard, one hundred and fifty hyperframes form each UMTS radio frame. To determine the latency as such frames are transmitted across the CPRI interfaces, a pattern matching circuit 200, which may be implemented in the programmable fabric or in hardwired PCS logic, determines when a code group is received that identifies a known place in the CPRI frame structure. For example, it is already conventional for FPGA core logic to generate a transmission synchronization ("sync") pulse to indicate the start of a UMTS radio frame. In FIG. 1, these sync pulses are labeled "tx_sync1" with regard to CPRI interface 115 and "tx_sync0" with regard to CPRI interface 110. Thus, with regard to point D in FPGA 100, the transmission of tx_sync1 indicates that a UMTS radio frame is beginning to be transmitted across interface 115. The time elapsed between detection of this sync pulse at point D and the detection of the same sync pulse at downstream points such as point E past interface 115 but prior to PCS/SERDES module 140 determines the data path latency between these points. However, any distinctive boundary or code sequence within the CPRI frame structure may be used as a timing mark. For example, a special code group such as an 8B/10B comma character (K28.5) as specified in section 32.2.4 of IEEE standard 802.3-2005 may be used as the timing mark. Alternatively, the detection of an incoming comma may be used to denote of a CPRI hyperframe as the timing mark.

Regardless of the particular timing mark used, it may be seen that the timing measurement circuit will start timing when some timing mark in the CPRI IQ data flow is detected at a first point in the FPGA and will stop timing when this same timing mark is detected at a second point in the FPGA. The resulting delay that is measured is the data path latency for the given FPGA design between those two points. Although it is possible to implement such a timing measurement circuit in the FPGA programmable core/fabric, it may be advantageous to implement the timing measurement circuit using hardwired logic instead. In that regard, the timing occurs according to a clock. The higher the clock rate for the clock, the more precision is provided in the resulting latency measurements. Because the FPGA core clock is relatively slow, the resulting precision will typically be better if the timing measurement circuit 160 is implemented in hard logic such as in the PCS/SERDES modules as illustrated in FIG. 1. Moreover, if timing measurement circuit 160 is implemented in the core logic, the routing delays of the required signals to and from the timing measurement circuit would introduce considerable design complexity. Thus, the following discussion will assume without loss of generality that hard logic is used to implement timing measurement circuits 160 within the PCS/SERDES modules.

As seen in FIG. 2, timing measurement circuit 160 may include a free running counter 205 to perform the desired timing responsive to cycles of a relatively-high-speed clock 210. Counter 205 starts running when both an enable signal 215 from a control register 220 and a start signal 225 are asserted. Thus, assuming enable signal 215 is asserted, counter 205 will start timing in response to start signal 225 being asserted. Start signal 225 is asserted upon the detection of some predetermined timing point within an input data frame or an output data frame with respect to a first given CPRI interface location by a first pattern matching circuit 200a. As discussed above, first pattern matching circuit 200a may be configured to detect a sync pulse or some other distinctive code within a CPRI data frame structure. Counter 205 will stop responsive to the assertion of a stop signal 230. Stop signal 230 is asserted when the same timing point is detected in an input data frame or output data frame at another CPRI interface location by a second pattern matching circuit 200b. The resulting latency determination—the time elapsed between detection of the timing point at the first CPRI interface location and the detection of the same timing point at the second CPRI interface location—is stored in a status register 235. Status register 235 may be reset by a reset signal (rst) 240 from control register 220. The FPGA core may be programmed to drive a controller interface 250 to drive control register 220 to assert enable signal 215 and also to receive the latency measurement from status register 235. Thus, controller interface 250 is controlling whether timing measurement circuit 160 is operational and also acts to receive the resulting latency measurement data. Note the advantages of the resulting FGPA latency measurement—an FPGA containing timing measurement circuit 160 may be configured to implement a communication interface such as CPRI that places tight constraints on the allowable data latency. Whereas it was conventional to meet such tight constraints by disabling FIFO operation as discussed previously, a user of an FPGA implementing timing measurement circuit 160 may now configure the FPGA to allow FIFO operation and verify that the latency requirements are still met though operation of timing measurement circuit 160 through interface 250.

The concept of "CPRI interface location" may be better understood with regard to the latency requirements imposed by the CPRI standard. For example, if CPRI interfaces 110 and 115 are the master and slave CPRI interfaces in a radio equipment (RE) component, the delay between points M and N is denoted as "Toffset." Thus, with regard to a latency measurement for Toffset, the first CPRI interface location (point M) is the input port to the master interface of the RE component. Similarly, the second CPRI interface location for such a determination is the output port for this master interface. In general, CPRI demands a very tight latency control such that the latency measurement may need an accuracy of just a few nanoseconds. But an FPGA fabric clock is typically on the order of 300 MHz, which merely provides a timing resolution of +/−3.3 ns. By implementing timing measurement circuit 160 in hardwired logic such as in the PCS/SERDES module, better resolution may be achievable. For example, if a 600 MHz clock is available in such a module, the resulting timing resolution is +/−1.7 ns. Alternatively, if a 3 GHz clock is available, the timing resolution is +/−333 ps. Thus, by implementing the timing measurement circuits using hardwired logic such as would be available in the PCS/SERDES modules, the timing resolution is typically improved markedly.

Figure 3:
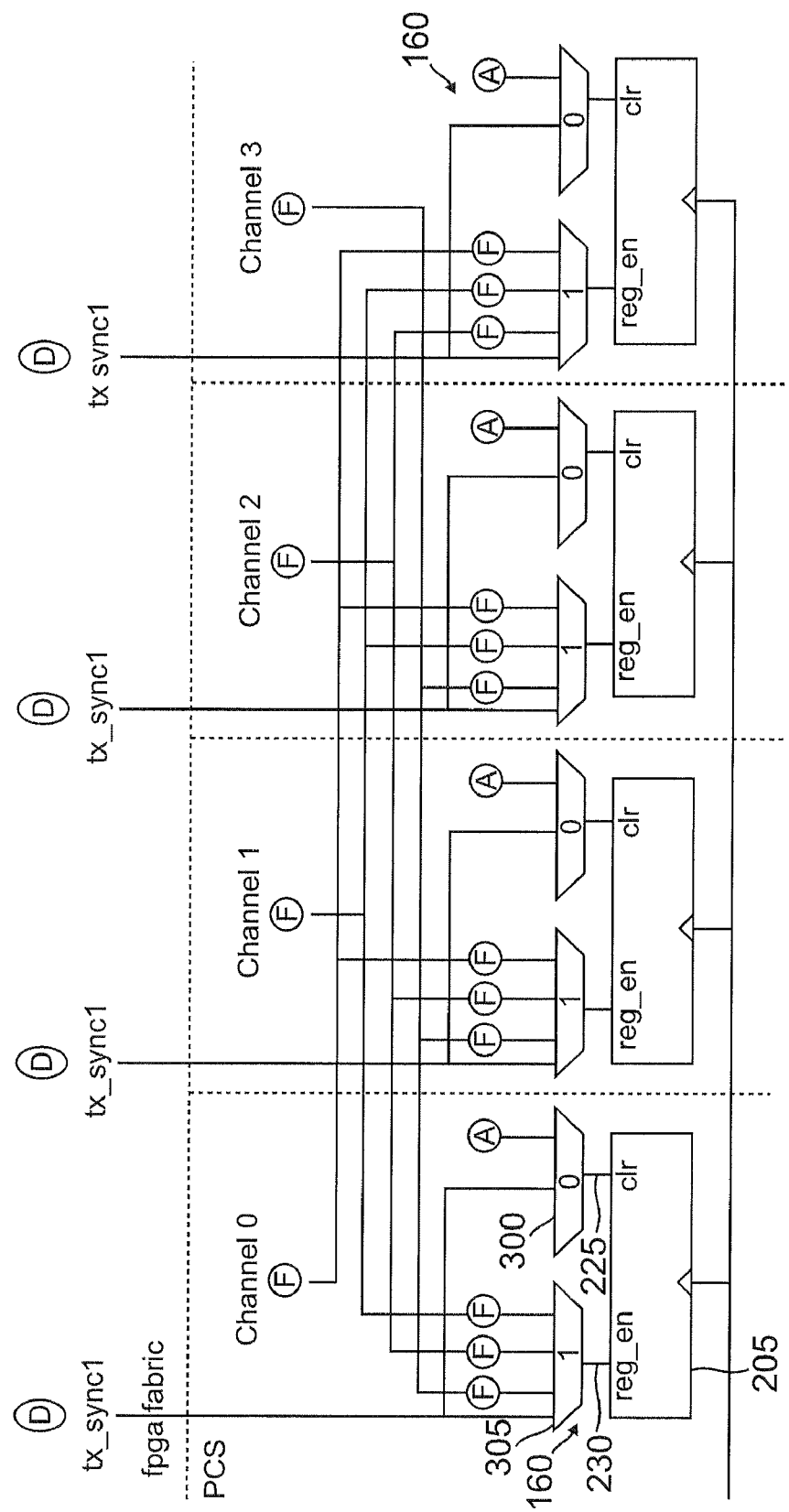
FIG. 3 illustrates a plurality of the timing measurement circuits from FIG. 2 configured to time the latency at various points within the FPGA of FIG. 1.

Referring again to FIG. 1, it is common to denote a receive/transmit pair of SERDES as a SERDES "channel." In turn, it is common practice to arrange SERDES channels into groups of four denoted as a "quad." Turning now to FIG. 3, four SERDES channels are shown as channel 0 through channel 3. It may be seen that the channels may share a single timing measurement circuit 160 although in the embodiment of FIG. 3, each SERDES channel has its own timing measurement circuit 160. To provide greater flexibility, the start and stop signals 225 and 230 for each channel may be selected through corresponding multiplexers 300 and 205, respectively, in each timing measurement circuit 160. In the embodiment illustrated, each multiplexer 300 may select either for the tx_sync1 signal corresponding to CPRI interface location D in FIG. 1 or the equivalent timing signal at CPRI interface location A. Similarly, each multiplexer 305 may select for the tx_sync1 signal from CPRI interface location A or the equivalent timing signal from CPRI interface location F. Thus, the timing measurement circuits 160 of FIG. 3 can measure the latency from point A to point D, from point D to point F, or from point A to point F. Through appropriate selection by the multiplexers, the latency between other arbitrary points (for example, from point B to point C) with regard to the CPRI interface may be readily determined.

Embodiments described above illustrate but do not limit the invention. It should also be understood that numerous modifications and variations are possible in accordance with the principles of the present invention. In that regard, the timing measurement circuit discussed herein may be implemented to measure the data path latency for numerous applications besides CPRI. All that is needed is that the data communication across the data paths whose latency is being measured includes some suitable timing point. A corresponding pattern matching circuit may then detect the arrival of the timing point at a first location in a desired data path and trigger the timing measurement circuit to begin timing. Upon the detection of the same timing point at a second location in data path, the timing measurement circuit is stopped so that the resulting data latency measurement may be received by the FPGA. Accordingly, the scope of the invention is defined only by the following claims.

The invention claimed is:

1. A programmable logic device comprising:
a programmable fabric within the device; and
hard logic within the device coupled to the programmable fabric, the hard logic including a timing measurement circuit adapted to measure latency of a data path between first and second points in the programmable logic device.

2. The programmable logic device of claim 1, wherein the hard logic includes a SERDES channel and at least a portion of the data path is within the SERDES channel.

3. The programmable logic device of claim 2, wherein the portion of the data path within the SERDES channel includes a FIFO buffer.

4. The programmable logic device of claim 1, wherein at least a portion of the data path is within the programmable fabric.

5. The programmable logic device of claim 4, wherein the portion of the data path within the programmable fabric includes a FIFO buffer.

6. The programmable logic device of claim 1, wherein the timing measurement circuit is adapted to measure the latency of the data path in real time.

7. The programmable logic device of claim 1, wherein the timing measurement circuit includes:
   a first pattern matching circuit coupled to the first point;
   a second pattern matching circuit coupled to the second point;
   a counter responsive to the first pattern matching circuit; and
   a status register coupled to the counter and responsive to the second pattern matching circuit.

8. The programmable logic device of claim 1, wherein the timing measurement circuit is adapted to measure the latency of the data path between the first and second points by:
   detecting a timing mark at the first point, the timing mark included in data flowing in the data path; and
   detecting the timing mark at the second point.

9. The programmable logic device of claim 8, wherein the timing measurement circuit is adapted to measure the latency of the data path between the first and second points by counting the number of clock cycles between detections of the timing mark at the first and second points.

10. The programmable logic device of claim 8, wherein the timing mark includes a sync pulse.

11. The programmable logic device of claim 8, wherein the timing mark includes an 8B/10B comma character.

12. A programmable logic device comprising:
   a programmable fabric within the device; and
   hard logic within the device coupled to the programmable fabric, the hard logic including a timing measurement circuit adapted to measure latency of a data path between multiple points in the programmable logic device, the timing measurement circuit including:
      a plurality of pattern matching circuits, each coupled to one of the points in the device;
      a counter;
      a first multiplexer coupled between at least two pattern matching circuits and the counter;
      a status register coupled to the counter; and
      a second multiplexer coupled between at least two pattern matching circuits and the status register.

13. The programmable logic device of claim 12, wherein the hard logic includes a SERDES channel and at least a portion of the data path is within the SERDES channel.

14. The programmable logic device of claim 13, wherein the portion of the data path within the SERDES channel includes a FIFO buffer.

15. The programmable logic device of claim 12, wherein at least a portion of the data path is within the programmable fabric.

16. The programmable logic device of claim 15, wherein the portion of the data path within the programmable fabric includes a FIFO buffer.

17. A non-transitory computer-readable medium on which is stored a computer program for implementing a link interface within a programmable fabric of a programmable logic device, the device including hard logic that implements a timing measurement circuit adapted to measure latency of a data path through the interface from a first point in the device to a second point in the device.

18. The computer-readable medium of claim 17, wherein the link interface is a Common Public Radio Interface (CPRI) interface.

19. The computer-readable medium of claim 17, wherein the link interface is an Open Base Station Architecture Initiative (OBSAI) interface.

\* \* \* \* \*